(12) United States Patent
Yoon et al.

(10) Patent No.: US 12,402,473 B2
(45) Date of Patent: Aug. 26, 2025

(54) DISPLAY DEVICE AND METHOD OF MANUFACTURING THE SAME

(71) Applicant: Samsung Display Co., Ltd., Yongin-Si (KR)

(72) Inventors: Seungho Yoon, Hwaseong-si (KR); Seungyong Song, Suwon-si (KR); Sooyoun Kim, Siheung-si (KR); Woo Yong Sung, Seoul (KR); Heejun Yang, Hwaseong-si (KR); Sehoon Jeong, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 759 days.

(21) Appl. No.: 17/680,099

(22) Filed: Feb. 24, 2022

(65) Prior Publication Data

US 2023/0050328 A1 Feb. 16, 2023

(30) Foreign Application Priority Data

Aug. 10, 2021 (KR) ........................ 10-2021-0105536

(51) Int. Cl.
*H10K 50/84* (2023.01)
*H10H 20/852* (2025.01)
*H10K 59/131* (2023.01)
*H10K 71/00* (2023.01)
*H10H 20/01* (2025.01)

(52) U.S. Cl.
CPC ........... *H10K 50/84* (2023.02); *H10H 20/852* (2025.01); *H10K 59/131* (2023.02); *H10K 71/00* (2023.02); *H10H 20/0362* (2025.01)

(58) Field of Classification Search
CPC .... H10K 59/131; H10K 50/84; H10K 59/124; H10K 59/873; H10K 50/844; H10H 20/852; H10H 20/0362; H01L 2224/7501; H01L 23/53295
See application file for complete search history.

(56) References Cited

U.S. PATENT DOCUMENTS

| 2020/0006461 | A1 | 1/2020 | Cho et al. |
| 2020/0042123 | A1* | 2/2020 | Kim ........................ G06F 3/047 |
| 2020/0259119 | A1 | 8/2020 | Jung et al. |
| 2022/0028963 | A1 | 1/2022 | Lee et al. |

FOREIGN PATENT DOCUMENTS

| KR | 10-2015-0061572 A | 6/2015 |
| KR | 10-1920762 B1 | 11/2018 |
| KR | 10-2020-0003332 A | 1/2020 |
| KR | 10-2096800 B1 | 4/2020 |
| KR | 10-2020-0087368 A | 7/2020 |

* cited by examiner

*Primary Examiner* — Wasiul Haider
(74) *Attorney, Agent, or Firm* — Innovation Counsel LLP

(57) ABSTRACT

A display device includes a substrate, a pixel, an encapsulation layer, a pad electrode, and a circuit board. The substrate includes a display area and a pad area positioned outside the display area. The pixel is disposed on the display area. The encapsulation layer covers the pixel. The pad electrode is disposed on the pad area. A first surface of the pad electrode contains fluorine, overlaps a second surface of the pad electrode, and is positioned farther from the substrate than the second surface of the pad electrode is. The circuit board overlaps the pad electrode.

24 Claims, 12 Drawing Sheets

DISPLAY DEVICE AND METHOD OF MANUFACTURING THE SAME

CROSS-REFERENCE TO RELATED APPLICATION(S)

This application claims priority to Korean Patent Application No. 10-2021-0105536 filed on Aug. 10, 2021; the Korean Patent Application is incorporated by reference.

BACKGROUND

1. Field

The technical field relates to a display device and a method of manufacturing the display device.

2. Description of the Related Art

Display devices may display images according to input signals. Modern display devices include liquid crystal display devices and organic light emitting diode display devices.

A display device may include a display panel for generating an image and may include a circuit board for providing driving signals to the display panel. The circuit board may be electrically connected to pad electrodes of the display panel. If the circuit board is not properly connected to the pad electrode or if the resistance of the pad electrodes is high, the reliability of the display device may be unsatisfactory.

SUMMARY

Embodiments may be related a display device with satisfactory reliability.

Embodiments may be related to a method of manufacturing a display device with satisfactory reliability.

A display device according to an embodiment may include a substrate including a display area and a pad area positioned outside the display area, a pixel disposed in the display area on the substrate, an encapsulation layer disposed in the display area on the substrate and covering the pixel, a pad electrode disposed in the pad area on the substrate, wherein an upper surface of the pad electrode contains fluorine, and a circuit board attached on the pad electrode.

A fluorine content of the upper surface of the pad electrode may be equal to or greater than about 5 at %.

A silicon content of the upper surface of the pad electrode may be less than about 5 at %.

A fluorine content of the upper surface of the pad electrode may be greater than a silicon content of the upper surface of the pad electrode.

A surface roughness of the upper surface of the pad electrode may be greater than a surface roughness of an upper surface of the encapsulation layer.

The encapsulation layer may include a first inorganic encapsulation layer, an organic encapsulation layer disposed on the first inorganic encapsulation layer, and a second inorganic encapsulation layer disposed on the organic encapsulation layer. The second inorganic encapsulation layer may extend from the display area to an area between the display area and the pad area. At least a portion of an upper surface of the second inorganic encapsulation layer may contain fluorine.

Only an end portion of the upper surface of the second inorganic encapsulation layer adjacent to the pad area may contain fluorine.

An entire upper surface of the second inorganic encapsulation layer may contain fluorine.

A first taper angle of an end portion of the first inorganic encapsulation layer adjacent to the pad area or a second taper angle of an end portion of the second inorganic encapsulation layer adjacent to the pad area may be equal to or less than about 50 degrees.

A side surface of the first inorganic encapsulation layer adjacent to the pad area and a side surface of the second inorganic encapsulation layer adjacent to the pad area may be aligned with each other.

A display device according to an embodiment may include a substrate including a display area and a pad area positioned outside the display area, a pixel disposed in the display area on the substrate, an encapsulation layer disposed in the display area on the substrate and covering the pixel, a pad electrode disposed in the pad area on the substrate, and a circuit board attached on the pad electrode. The encapsulation layer may include a first inorganic encapsulation layer, an organic encapsulation layer disposed on the first inorganic encapsulation layer, and a second inorganic encapsulation layer disposed on the organic encapsulation layer and extending from the display area to an area between the display area and the pad area. At least a portion of an upper surface of the second inorganic encapsulation layer may contain fluorine.

Only an end portion of the upper surface of the second inorganic encapsulation layer adjacent to the pad area may contain fluorine.

An entire upper surface of the second inorganic encapsulation layer may contain fluorine.

A first taper angle of an end portion of the first inorganic encapsulation layer adjacent to the pad area or a second taper angle of an end portion of the second inorganic encapsulation layer adjacent to the pad area may be equal to or less than about 50 degrees.

An upper surface of the pad electrode may contain fluorine.

A fluorine content of the upper surface of the pad electrode may be equal to or greater than about 5 at %.

A silicon content of the upper surface of the pad electrode may be less than about 5 at %.

A fluorine content of the upper surface of the pad electrode may be greater than a silicon content of the upper surface of the pad electrode.

A method of manufacturing a display device according to an embodiment may include forming a pixel in a display area and a pad electrode in a pad area positioned outside the display area on a substrate, forming an encapsulation layer covering the pixel in the display area on the substrate, treating the pad area using a fluorine compound to remove a residual layer on an upper surface of the pad electrode, and attaching a circuit board on the pad electrode.

The forming of the encapsulation layer may include forming a first inorganic encapsulation layer including a silicon compound and spaced apart from the pad area, forming an organic encapsulation layer in the display area on the first inorganic encapsulation layer, and forming a second inorganic encapsulation layer including a silicon compound and spaced apart from the pad area on the organic encapsulation layer. The residual layer may be simultaneously formed with the first inorganic encapsulation layer or the second inorganic encapsulation layer.

In the treating of the pad area, only the pad area may be selectively treated using a fluorine compound.

A thickness of the residual layer may be less than a thickness of the second inorganic encapsulation layer. In the treating of the pad area, the display area and the pad area may be entirely treated using a fluorine compound.

The treating of the pad area may use a gas plasma including a fluorine compound.

The treating of the pad area may use a solution including a fluorine compound.

An embodiment may be related to a display device. The display device may include a substrate, a pixel, an encapsulation layer, a pad electrode, and a circuit board. The substrate may include a display area and a pad area positioned outside the display area. The pixel may be disposed on the display area. The encapsulation layer may cover the pixel. The pad electrode may be disposed on the pad area. A first surface of the pad electrode may contain fluorine, may overlap a second surface of the pad electrode, and may be positioned farther from the substrate than the second surface of the pad electrode is. The circuit board may overlap the pad electrode.

A fluorine content of the first surface of the pad electrode may be equal to or greater than 5 atomic percent.

A silicon content of the first surface of the pad electrode may be less than 5 atomic percent.

A fluorine content of the first surface of the pad electrode may be greater than a silicon content of the first surface of the pad electrode.

A surface roughness of the first surface of the pad electrode may be greater than a surface roughness of a first surface of the encapsulation layer. The first surface of the encapsulation layer may overlap a second surface of the encapsulation layer and may be positioned farther from the substrate than the second surface of the encapsulation layer is.

The encapsulation layer may include a first inorganic encapsulation layer, an organic encapsulation layer disposed on the first inorganic encapsulation layer, and a second inorganic encapsulation layer disposed on the organic encapsulation layer. The second inorganic encapsulation layer may extend from the display area to an area between the display area and the pad area. A first portion of a first surface of the second inorganic encapsulation layer may contain fluorine and may be positioned farther from the substrate than a second surface of the second inorganic encapsulation layer is.

The first portion of the first surface of the second inorganic encapsulation layer may be an end portion of the first surface of the second inorganic encapsulation layer positioned between the pixel and the pad area. The second inorganic encapsulation layer may contain fluorine only at the end portion of the first surface of the second inorganic encapsulation layer.

The first portion of the first surface of the second inorganic encapsulation layer may overlap each of the display area and the area between the display area and the pad area.

An end face of the first inorganic encapsulation layer may be positioned between the pixel and the pad area and may be oriented at a first angle relative to the substrate. An end face of the second inorganic encapsulation layer may be positioned between the pixel and the pad area and may be oriented at a second angle relative to the substrate. At least one of the first angle and the second angle may be equal to or less than 50 degrees.

An end face of the first inorganic encapsulation layer and an end face of the second inorganic encapsulation layer may be positioned between the pixel and the pad area and may be coplanar with each other.

An embodiment may be related to a display device. The display device may include a substrate, a pixel, an encapsulation layer, a pad electrode, and a circuit board. The substrate may include a display area and a pad area positioned outside the display area. The pixel may be disposed on the display area. The encapsulation layer may cover the pixel and may include a first inorganic encapsulation layer, an organic encapsulation layer disposed on the first inorganic encapsulation layer, and a second inorganic encapsulation layer disposed on the organic encapsulation layer and extending from the display area to an area between the display area and the pad area. A first portion of a first surface of the second inorganic encapsulation layer may contain fluorine and may be positioned farther from the substrate than a second surface of the second inorganic encapsulation layer is. The pad electrode may be disposed on the pad area. The circuit board may overlap the pad electrode.

The first portion of the first surface of the second inorganic encapsulation layer may be an end portion of the first surface of the second inorganic encapsulation layer positioned between the pixel and the pad area. The second inorganic encapsulation layer may contain fluorine only at the end portion of the first surface of the second inorganic encapsulation layer.

The first portion of the first surface of the second inorganic encapsulation layer may overlap each of the display area and the area between the display area and the pad area.

An end face of the first inorganic encapsulation layer may be positioned between the pixel and the pad area and may be oriented at a first angle relative to the substrate. An end face of the second inorganic encapsulation layer may be positioned between the pixel and the pad area and may be oriented at a second angle relative to the substrate. At least one of the first angle and the second angle may be equal to or less than about 50 degrees.

A first surface of the pad electrode may contain fluorine, may overlap a second surface of the pad electrode, and may be positioned farther from the substrate than the second surface of the pad electrode is.

A fluorine content of the first surface of the pad electrode may be equal to or greater than 5 atomic percent.

A silicon content of the first surface of the pad electrode may be less than 5 atomic percent.

A fluorine content of the first surface of the pad electrode may be greater than a silicon content of the first surface of the pad electrode.

An embodiment may be related to a method for manufacturing a display device. The method may include the following steps: forming a pad electrode on a pad area of a substrate; forming a pixel on a display area of the substrate, wherein the pad area of the substrate may be positioned outside the display area of the substrate; forming an encapsulation layer that covers the pixel; treating the pad electrode using a fluorine compound to remove a residual layer from a first surface of the pad electrode, wherein the first surface of the pad electrode may overlap a second surface of the pad electrode and may be positioned farther from the substrate than the second surface of the pad electrode is; and providing a circuit board that overlaps the pad electrode.

The forming of the encapsulation layer may include the following steps: forming a first inorganic encapsulation layer, which includes a first silicon compound and is spaced from the pad area; forming an organic encapsulation layer, which overlaps the display area and overlaps (and directly contacts) the first inorganic encapsulation layer; and forming a second inorganic encapsulation layer, which includes a second silicon compound, is spaced from the pad area, and overlaps (and directly contacts) the organic encapsulation layer. The second silicon compound may be identical to or different from the first silicon compound. The residual layer and the first inorganic encapsulation layer or the second inorganic encapsulation layer are formed simultaneously and are formed of a same material.

In the treating of the pad electrode, the pad area may be selectively treated using the fluorine compound when the display area is spaced from the fluorine compound.

A thickness of the residual layer may be less than a thickness of the second inorganic encapsulation layer. In the treating of the pad electrode, both the display area and the pad area may be treated using the fluorine compound.

The treating of the pad area may use gas plasma that includes the fluorine compound.

The treating of the pad area may use a solution that includes the fluorine compound.

According to embodiments, after the encapsulation layer is formed and before the circuit board is attached, the residual layer may be reduced by treatment of the pad electrode and/or the pad area using a fluorine compound. Accordingly, signals provided by the circuit board may be properly transmitted to the pad electrode, without being hindered by the residual layer. The upper surface of the pad electrode may be hydrophilic treated by the fluorine compound. Accordingly, an increase in resistance of the pad electrode potentially caused by contamination of the upper surface of the pad electrode may be prevented or minimized. Advantageously, the reliability of the display device may be satisfactory.

DETAILED DESCRIPTION

Examples of embodiments are described with reference to the accompanying drawings.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

The term "connect" may mean "directly connect" or "indirectly connect." The term "connect" may mean "mechanically connect" and/or "electrically connect." The term "connected" may mean "electrically connected" or "electrically connected through no intervening transistor." The term "insulate" may mean "electrically insulate" or "electrically isolate." The term "conductive" may mean "electrically conductive." The term "drive" may mean "operate" or "control." The term "include" may mean "be made of." The term "adjacent" may mean "immediately adjacent." The expression that an element extends in a particular direction may mean that the element extends lengthwise in the particular direction and/or that the lengthwise direction of the element is in the particular direction. The term "define" may mean "form" or "provide." The expression that a space or opening overlaps an object may mean that (the position of) the space or opening overlaps with (the position of) the object. The term "overlap" may be equivalent to "be overlapped by." The expression that a first element overlaps with a second element in a plan view may mean that the first element overlaps the second element in direction perpendicular to a substrate. The symbol "at %" may mean "at. %" or "atomic percent." The term "upper" may mean "farther-from-the-substrate" or "farthest-from-the-substrate." When elements are substantially simultaneously formed, the elements may be formed of the same material(s).

Figure 1:
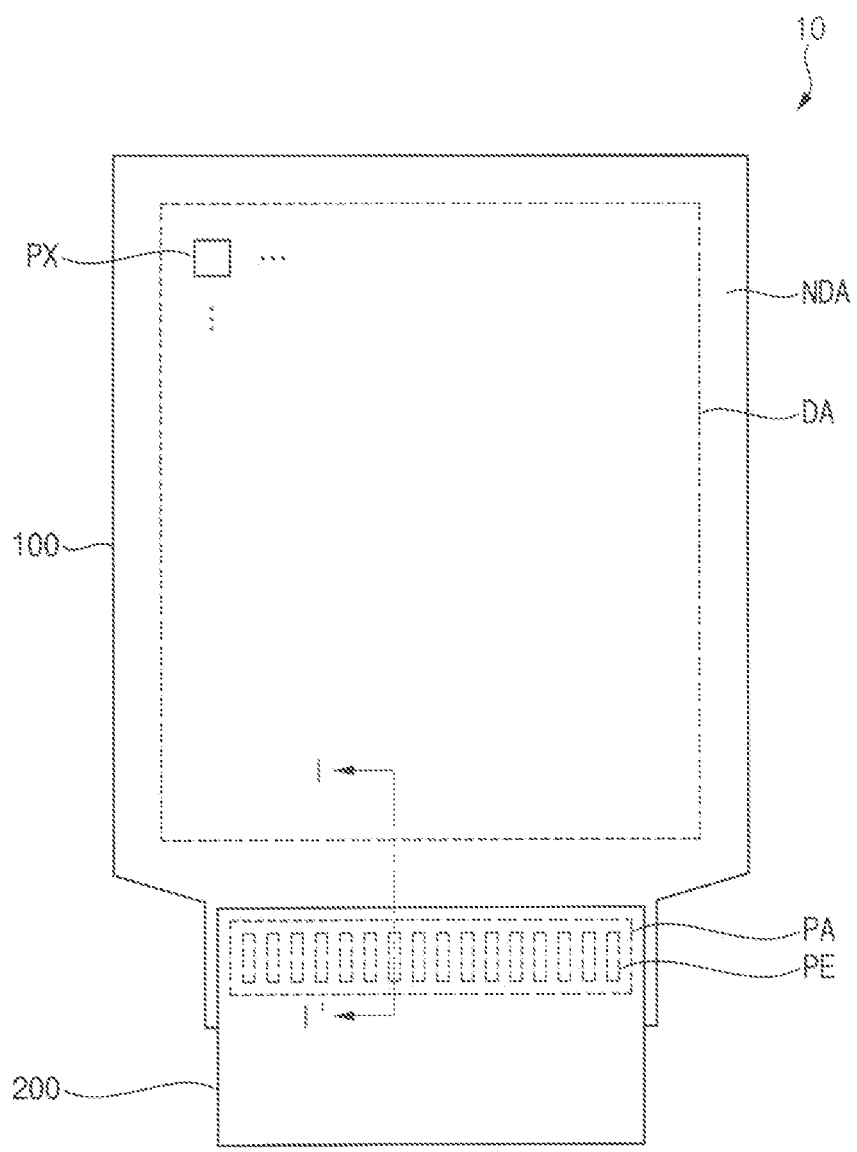
FIG. 1 is a plan view illustrating a display device according to an embodiment.

FIG. 1 is a plan view illustrating a display device according to an embodiment.

Referring to FIG. 1, a display device 10 may include a display panel 100 and a circuit board 200.

The display panel 100 may include a plurality of pixels for generating an image. Each of the pixels may include at least one thin film transistor and a light emitting element. Light emitted from each of the pixels may be combined to generate the image. The display panel 100 may provide the generated image toward an upper surface.

The display panel 100 may include a display area DA and a non-display area NDA. The pixels PX may be disposed in the display area DA. The non-display area NDA may be positioned outside the display area DA. For example, the non-display area NDA may surround the display area DA in a plan view of the display panel 100.

The non-display area NDA may include a pad area PA in which pad electrodes PE are disposed. The pad area PA may be positioned outside the display area DA. Although one pad area PA is illustrated in FIG. 1, the non-display area NDA can include a plurality of pad areas PA.

The circuit board 200 may be attached on a side of the display panel 100. An end portion of the circuit board 200 may overlap the pad area PA. The circuit board 200 may be electrically connected to the pad electrodes PE through a conductive film. For example, the circuit board 200 may be attached on the display panel 100 by an anisotropic conductive film (ACF) and may be electrically connected to the pad electrodes PE.

The circuit board 200 may be a flexible printed circuit board (FPCB). A printed circuit board (PCB) (not illustrated) may be attached on another end portion of the circuit board 200.

The display device 10 may further include a driving circuit chip (not illustrated). The driving circuit chip may be directly mounted on the display panel 100 in a chip on plastic (COP) configuration or a chip on glass (COG) configuration, or may be mounted on the circuit board 200 attached on the display panel 100 in a chip on film (COF) configuration.

The circuit board 200, the printed circuit board, and the driving circuit chip may provide driving signals to the display panel 100 for controlling the display panel 100. The driving signals may include a driving voltage, gate signals, data signals, or the like.

The display panel 100 may be a flexible display panel. The display panel 100 may be a rigid display panel.

When the display panel 100 is a flexible display panel, the non-display area NDA may include a bending area (not illustrated). The bending area may be positioned between the display area DA and the pad area PA. The bending area of the display panel 100 may be bent such that the pad area PA is positioned under/behind the display area DA. Accordingly, a bezel area of the display device 10 may be reduced.

Figure 2:
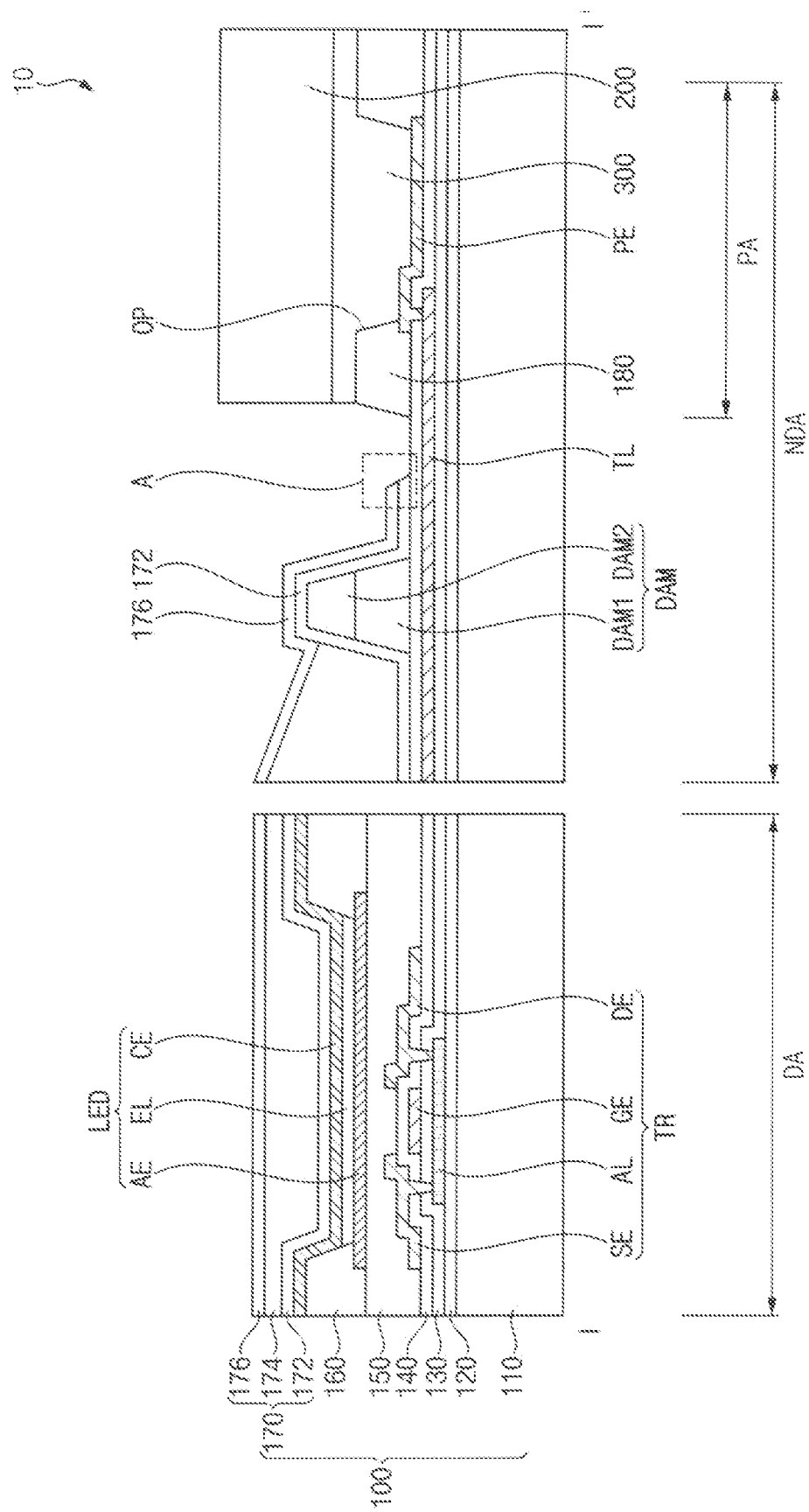
FIG. 2 is a cross-sectional view taken along line I-I' of FIG. 1 according to an embodiment.

FIG. 2 is a cross-sectional view taken along line I-I' of FIG. 1 according to an embodiment.

Referring to FIGS. 1 and 2, The display panel 100 may include a substrate 110, a buffer layer 120, a thin film transistor TR, a light emitting element LED, an encapsulation layer 170, a transmission line TL, and a pad electrode PE. The substrate 110 may include a display area DA, a non-display area NDA, and a pad area PA respectively corresponding to the display area DA, the non-display area NDA, and the pad area PA of the display panel 100. The thin film transistor TR and the light emitting element LED may be disposed in the display area DA on the substrate 110 (i.e., disposed on the display area DA of the substrate 110). The thin film transistor TR may include an active layer AL, a gate electrode GE, a source electrode SE, and a drain electrode DE. The light emitting element LED may include an anode AE, an emission layer EL, and a cathode CE. The pad electrode PE may be disposed in the pad area PA on the substrate 110 (i.e., disposed on the pad area PA of the substrate 110).

The substrate 110 may be an insulating substrate formed of a transparent or opaque material. The substrate 110 may include glass, and the display panel 100 may be a rigid display panel. The substrate 110 may include plastic, and the display panel 100 may be a flexible display panel.

The buffer layer 120 may be disposed on the substrate 110. The buffer layer 120 may prevent or reduce instances of impurities diffusing into the active layer AL from the substrate 110. The buffer layer 120 may include an inorganic insulating material such as a silicon compound, a metal oxide, or the like. Examples of the inorganic insulating material may include silicon oxide (SiO), silicon nitride (SiN), silicon oxynitride (SiON), silicon oxycarbide (SiOC), silicon carbonitride (SiCN), aluminum oxide (AlO), aluminum nitride (AlN), tantalum oxide (TaO), hafnium oxide (HfO), zirconium oxide (ZrO), and titanium oxide (TiO). These materials can be used alone or in combination. The buffer layer 120 may have a single-layered structure or a multi-layered structure including a plurality of insulating layers. The buffer layer 120 may be disposed in both the display area DA and the non-display area NDA on the substrate 110.

The active layer AL may be disposed on the buffer layer 120. The active layer AL may include an oxide semiconductor, a silicon semiconductor, an organic semiconductor, or the like. The oxide semiconductor may include an oxide of at least one of indium (In), gallium (Ga), tin (Sn), zirconium (Zr), vanadium (V), hafnium (Hf), cadmium (Cd), germanium (Ge), chromium (Cr), titanium (Ti), and zinc (Zn). The silicon semiconductor may include an amorphous silicon, a polycrystalline silicon, or the like. The active layer AL may include a source area, a drain area, and a channel area positioned between the source area and the drain area.

A first insulating layer 130 may be disposed on the active layer AL. The first insulating layer 130 may cover the active layer AL on the buffer layer 120. The first insulating layer 130 may be disposed in both the display area DA and the non-display area NDA on the buffer layer 120. The first insulating layer 130 may include an inorganic insulating material. The first insulating layer 130 may be referred to as a gate insulating layer.

The gate electrode GE may be disposed on the first insulating layer 130. The gate electrode GE may overlap the channel area of the active layer AL. The gate electrode GE may include a conductive material such as a metal, an alloy, a conductive metal nitride, a conductive metal oxide, a transparent conductive material, or the like. Examples of the conductive material may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Jr), alloys containing aluminum, alloys containing silver, alloys containing copper, alloys containing molybdenum, aluminum nitride (AlN), tungsten nitride (WN), titanium nitride (TiN), chromium nitride (CrN), tantalum nitride (TaN), strontium ruthenium oxide (SrRuO), zinc oxide (ZnO), indium tin oxide (ITO), tin oxide (SnO), indium oxide (InO), gallium oxide (GaO), and indium zinc oxide (IZO). These can be used alone or in combination. The gate electrode GE may have a single-layered structure or a multi-layered structure including a plurality of conductive layers.

A second insulating layer 140 may be disposed on the gate electrode GE. The second insulating layer 140 may cover the gate electrode GE on the first insulating layer 130. The second insulating layer 140 may be disposed in both the display area DA and the non-display area NDA on the first insulating layer 130. The second insulating layer 140 may include an inorganic insulating material. The second insulating layer 140 may be referred to as an interlayer insulating layer.

The source electrode SE and the drain electrode DE may be disposed on the second insulating layer 140. The source electrode SE and the drain electrode DE may be connected to the source area and the drain area of the active layer AL, respectively. Each of the source electrode SE and the drain electrode DE may include a conductive material. The active layer AL, the gate electrode GE, the source electrode SE, and the drain electrode DE may form the thin film transistor TR.

A third insulating layer 150 may be disposed on the source electrode SE and the drain electrode DE. The third insulating layer 150 may include an organic insulating material.

Examples of the organic insulating material may include a photoresist, a polyacryl-based resin, a polyimide-based resin, a polyamide-based resin, a siloxane-based resin, an acryl-based resin, an epoxy-based resin, or the like. These can be used alone or in combination.

The third insulating layer 150 may be disposed in the display area DA on the second insulating layer 140. The third insulating layer 150 may be referred to as a via insulating layer.

The anode AE may be disposed on the third insulating layer 150. The anode AE may include a conductive material. The anode AE may be connected to the drain electrode DE through a contact hole formed in the third insulating layer 150. Accordingly, the anode AE may be electrically connected to the thin film transistor TR.

A fourth insulating layer 160 may be disposed on the anode AE. The fourth insulating layer 160 may cover a peripheral portion of the anode AE, and may define a pixel opening exposing a central portion of the anode AE. The fourth insulating layer 160 may include an organic insulating material. The fourth insulating layer 160 may be disposed in the display area DA on the third insulating layer 150. The fourth insulating layer 160 may be referred to as a pixel defining layer.

The emission layer EL may be disposed on the anode AE. The emission layer EL may be disposed in the pixel opening of the fourth insulating layer 160. The emission layer EL may include at least one of an organic light emitting material or quantum dot.

The organic light emitting material may include a low molecular organic compound or a high molecular organic compound. Examples of the low molecular organic compound may include copper phthalocyanine, N,N'-diphenyl-benzidine, and tris-(8-hydroxyquinoline)aluminum. Examples of the high molecular organic compound may include poly(3,4-ethylenedioxythiophene), polyaniline, and poly-phenylenevinylene, polyfluorene. These can be used alone or in combination.

The quantum dot may include a core including a Group II-VI compound, a Group III-V compound, a Group IV-VI compound, a Group IV element, and/or a Group IV compound. The quantum dot may have a core-shell structure including the core and a shell surrounding the core. The shell may serve as a protection layer for preventing the core from being chemically denatured to maintain semiconductor characteristics, and may serve as a charging layer for imparting electrophoretic characteristics to the quantum dot.

The cathode CE may be disposed on the emission layer EL. The cathode CE may also be disposed on the fourth insulating layer 160. The cathode CE may include a conductive material. Light emitting functional layers, such as a hole injection layer (HIL), a hole transporting layer (HTL), an electron transporting layer (ETL), and/or an electron injection layer (EIL), may be disposed between the anode AE and the cathode CE. The anode AE, the emission layer EL, and the cathode CE may form the light emitting element LED.

The encapsulation layer 170 may be disposed on the cathode CE. The encapsulation layer 170 may cover the light emitting element LED. The encapsulation layer 170 may seal the display area DA to protect the light emitting element LED from external impurities.

The encapsulation layer 170 may include at least one inorganic encapsulation layer and at least one organic encapsulation layer. The encapsulation layer 170 may include a first inorganic encapsulation layer 172 disposed on the cathode CE, an organic encapsulation layer 174 disposed on the first inorganic encapsulation layer 172, and a second inorganic encapsulation layer 176 disposed on the organic encapsulation layer 174.

Each of the first inorganic encapsulation layer 172 and the second inorganic encapsulation layer 176 may include an inorganic insulating material. For example, each of the first inorganic encapsulation layer 172 and the second inorganic encapsulation layer 176 may include a silicon compound such as silicon oxide, silicon nitride, or silicon oxynitride.

The organic encapsulation layer 174 may include an organic insulating material. The organic encapsulation layer 174 may be formed by an inkjet method, in which an ink or a solution including an organic material is discharged onto the first inorganic encapsulation layer 172.

The display panel 100 may include a dam DAM disposed in the non-display area NDA on the substrate 110. The dam DAM may be disposed between the display area DA and the pad area PA. When the organic encapsulation layer 174 is formed by an inkjet method, the dam DAM may prevent or reduce the discharged organic material from overflowing toward an edge of the substrate 110 (e.g., a right direction in FIG. 2). The dam DAM may surround the display area DA in a plan view of the display panel 100.

The dam DAM may have a multi-layered structure including a lower layer DAM1 and an upper layer DAM2. The lower layer DAM1 and the third insulating layer 150 may be substantially simultaneously formed. The upper layer DAM2 and the fourth insulating layer 160 may be substantially simultaneously formed. Although one dam DAM is illustrated in FIG. 2, the display panel 100 may include a plurality of dams DAM.

Each of the first inorganic encapsulation layer 172 and the second inorganic encapsulation layer 176 may extend from the display area DA to an area between the display area DA and the pad area PA (i.e., a portion of the non-display area NDA adjacent to the display area DA). Each of the first inorganic encapsulation layer 172 and the second inorganic encapsulation layer 176 may cover the dam DAM. Each of the first inorganic encapsulation layer 172 and the second inorganic encapsulation layer 176 may be spaced apart from the pad area PA. An end portion of the first inorganic encapsulation layer 172 adjacent to the pad area PA and an end portion of the second inorganic encapsulation layer 176 adjacent to the pad area PA may be positioned between the dam DAM and the pad area PA. The end portion of the first inorganic encapsulation layer 172 adjacent to the pad area PA and the end portion of the second inorganic encapsulation layer 176 adjacent to the pad area PA may be positioned in a boundary of the pad area PA.

Figure 3:
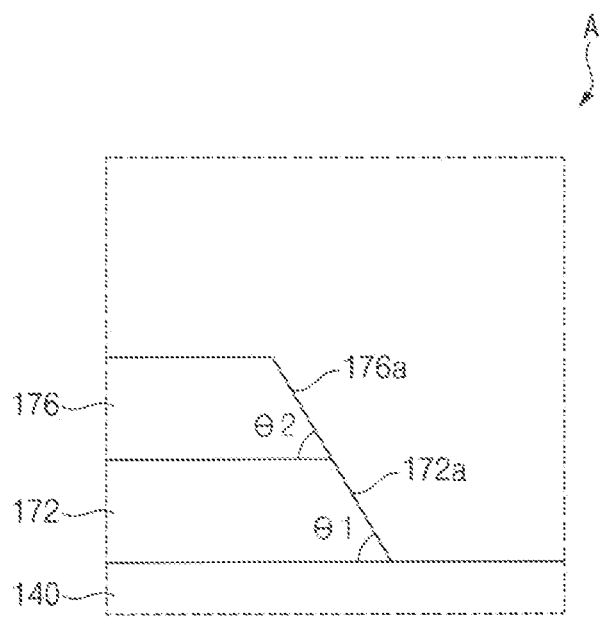
FIG. 3 is a view of area A of FIG. 2 according to an embodiment.

FIG. 3 is a view of area A of FIG. 2 according to an embodiment.

Referring to FIGS. 2 and 3, the end portion of the first inorganic encapsulation layer 172 adjacent to the pad area PA or the end portion of the second inorganic encapsulation layer 176 adjacent to the pad area PA may have a relatively small taper angle.

The end portion of the first inorganic encapsulation layer 172 adjacent to the pad area PA may have a first taper angle θ1. The end portion of the second inorganic encapsulation layer 176 adjacent to the pad area PA may have a second taper angle θ2. The first taper angle θ1 and/or the second taper angle θ2 may be equal to or less than about 50 degrees.

A side surface 172a of the first inorganic encapsulation layer 172 (i.e., a lateral face of the end portion of the first inorganic encapsulation layer 172) adjacent to the pad area PA and a side surface 176a of the second inorganic encapsulation layer 176 (i.e., a lateral face of the end portion of the second inorganic encapsulation layer 176) adjacent to the pad area PA may be aligned/coplanar with each other. The side surface 172a of the first inorganic encapsulation layer 172 may be oriented at the first taper angle θ1 relative to the second insulating layer 140 and/or the substrate 110. The side surface 176a of the second inorganic encapsulation layer 176 may be oriented at the second taper angle θ2 relative to the second insulating layer 140 and/or the substrate 110.

Referring to FIG. 2, the transmission line TL may be electrically connected to the pad electrode PE. The transmission line TL may be a fan-out line that transmits a data signal to a data line disposed in the display area DA. The transmission line TL may be a control signal line for transmitting a control signal to a gate driver, a power transmission line for transmitting a power voltage to the light emitting element LED disposed in the display area DA, or the like.

The transmission line TL may include a conductive material. The transmission line TL and the gate electrode GE may be substantially simultaneously formed of the same material(s) in the same process step. The transmission line TL and at least one of the conductive layers of the thin film transistor TR or the light emitting element LED disposed in the display area DA may be substantially simultaneously formed of the same material(s) in the same process step. The transmission line TL may have a single-layered structure or a multi-layered structure including a plurality of conductive layers.

The pad electrode PE may be disposed in the pad area PA on the substrate 110. The pad electrode PE may be electrically connected to the transmission line TL. The pad electrode PE, the source electrode SE, and the drain electrode DE may be substantially simultaneously formed of the same material(s) in the same process step. The pad electrode PE and at least one of the conductive layers of the thin film transistor TR or the light emitting element LED disposed in the display area DA may be substantially simultaneously formed of the same material(s) in the same process step. The pad electrode PE may have a single-layered structure or a multi-layered structure including a plurality of conductive layers.

An organic insulating layer 180 may be disposed on the pad electrode PE. The organic insulating layer 180 and the third insulating layer 150 or the fourth insulating layer 160 may be substantially simultaneously formed of the same material(s) in the same process step. The organic insulating layer 180 may include an opening OP exposing a portion (e.g., a central portion) of an upper surface of the pad electrode PE. A conductive film 300 and the circuit board 200 may be attached on the portion of the upper surface of the pad electrode PE exposed by the opening OP of the organic insulating layer 180. The circuit board 200 may be electrically connected to the pad electrode PE by the conductive film 300.

At least a portion of the upper surface of the pad electrode PE may contain fluorine (F). For example, the portion (e.g., the central portion) of the upper surface of the pad electrode PE exposed by the opening OP of the organic insulating layer 180 may contain fluorine.

Each of the first inorganic encapsulation layer 172 and the second inorganic encapsulation layer 176 (including a silicon compound) may be formed in an area on the substrate 110 outside the pad area PA using a deposition mask. Due to sagging of the deposition mask, some deposition material (including the silicon compound) may flow into the pad area PA and may form a residual layer. If the residual layer is formed on the exposed portion (e.g., the central portion) of the upper surface of the pad electrode PE exposed by the opening OP of the organic insulating layer 180 or if a foreign material remains on the portion of the upper surface of the pad electrode PE as a result of the manufacturing process, an electrical connection to the pad electrode PE may be unsatisfactory and/or the electrical resistance of the pad electrode PE may increase, and a reliability of the display device 10 may be unsatisfactory. In order to remove the residual layer or the foreign material, the pad area PA may be treated using a plasma surface treatment, dry etching, wet etching, or the like using a fluorine compound.

As a treatment intensity of the pad area PA using the fluorine compound increases (e.g., as the treatment power, flow rate, or pressure increases), the residual layer or the foreign material may be effectively removed. As a result, in the upper surface of the pad electrode PE (i.e., the central portion of the upper surface of the pad electrode PE exposed by the opening OP of the organic insulating layer 180), a silicon content may be reduced, and the fluorine content may increase. The fluorine content of the upper surface of the pad electrode PE may be greater than the silicon content of the upper surface of the pad electrode PE.

The fluorine content of the upper surface of the pad electrode PE may be equal to or greater than about 5 at %. Preferably, the fluorine content of the upper surface of the pad electrode PE may be equal to or greater than about 10 at %.

The silicon content of the upper surface of the pad electrode PE may be less than about 5 at %. Preferably, the silicon content of the upper surface of the pad electrode PE may be less than about 3 at %.

The fluorine content and the silicon content of the upper surface of the pad electrode PE may mean the fluorine content and the silicon content of the upper surface of one or each of the pad electrodes PE.

The treatment using the fluorine compound may be selectively performed on the pad area PA and not on other areas of the display panel 100. Therefore, a surface roughness of the upper surface of the pad electrode PE disposed in the pad area PA may be greater than a surface roughness of an upper surface of the encapsulation layer 170 (e.g., a surface roughness of an upper surface of the second inorganic encapsulation layer 176) disposed outside the pad area PA.

FIGS. 4 to 8 are cross-sectional views illustrating process steps and structures in a method of manufacturing the display device of FIG. 1 according to one or more embodiments.

Figure 4:
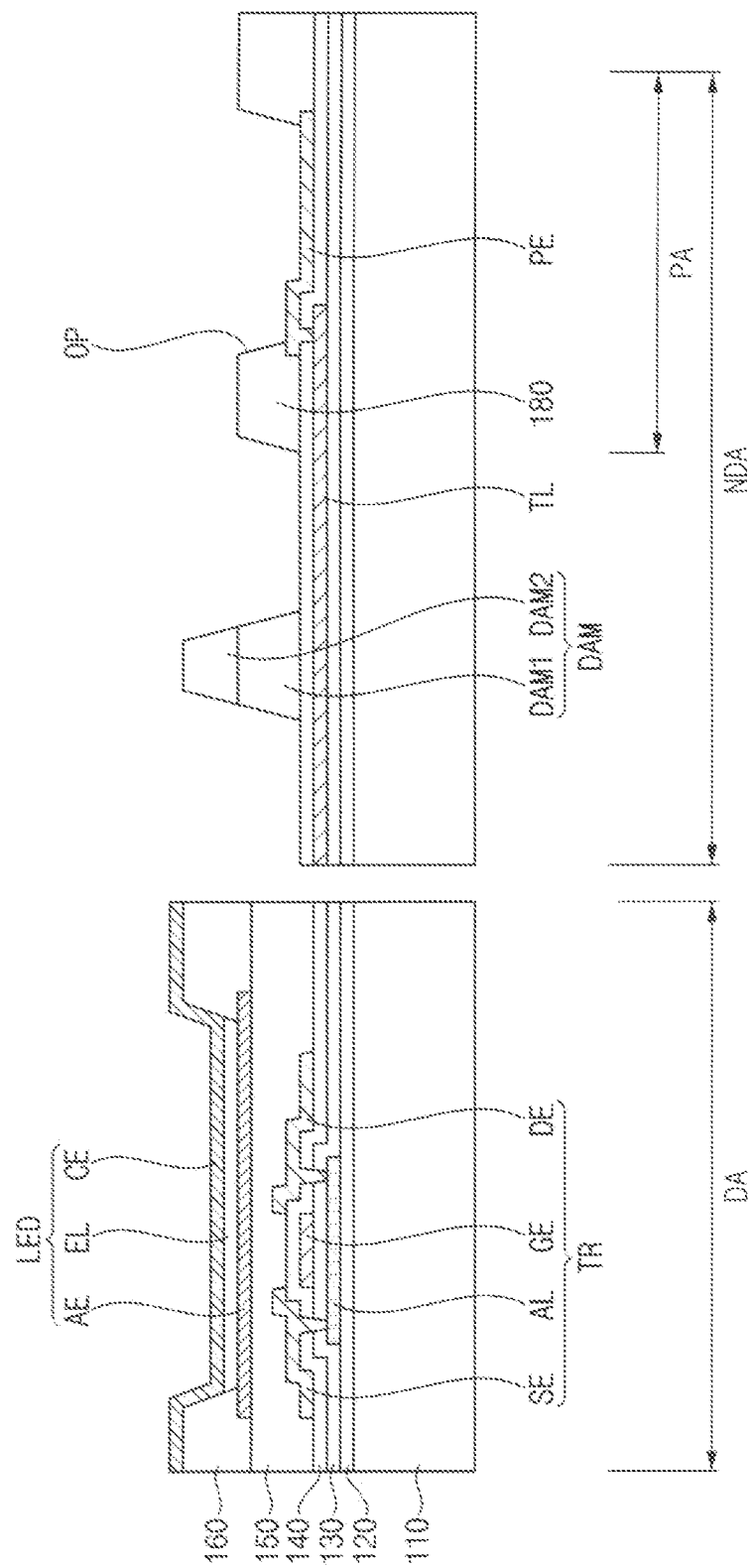
FIG. 4, FIG. 5, FIG. 6, FIG. 7, and FIG. 8 are cross-sectional views illustrating process steps and structures in a method of manufacturing the display device of FIG. 1 according to one or more embodiments.

Referring to FIG. 4, the pixel (including the thin film transistor TR and the light emitting element LED), the transmission line TL, the pad electrode PE, the dam DAM, and the organic insulating layer 180 may be formed on the substrate 110.

The substrate 110 may include the display area DA and the non-display area NDA (respectively corresponding to the display area DA and the non-display area NDA of the display panel 100). The non-display area NDA may be positioned outside the display area DA. The non-display area NDA may surround the display area DA in a plan view of the substrate 110. The non-display area NDA may include the pad area PA. The pad area PA may be positioned outside the display area DA.

The buffer layer 120, the active layer AL, the first insulating layer 130, the gate electrode GE, the second insulating layer 140, the source and drain electrodes SE and DE, the third insulating layer 150, the anode AE, the fourth insulating layer 160, the emission layer EL, and the cathode CE may be sequentially formed on the display area DA of the substrate 110. The first insulating layer 130, the second insulating layer 140, and the third insulating layer 150 may be formed on both the display area DA and the non-display area NDA.

The transmission line TL, the pad electrode PE, the dam DAM, and the organic insulating layer 180 may be formed on the non-display area NDA of the substrate 110. The transmission line TL may be formed in the process step of forming the gate electrode GE, and the pad electrode PE may be formed in the process step of forming the source and drain electrodes SE and DE. The organic insulating layer 180 may be formed in the process step of forming the third insulating layer 150 or the fourth insulating layer 160. The opening OP exposing a portion (e.g., a central portion) of an upper surface of the pad electrode PE may be formed in the organic insulating layer 180.

Figure 5:
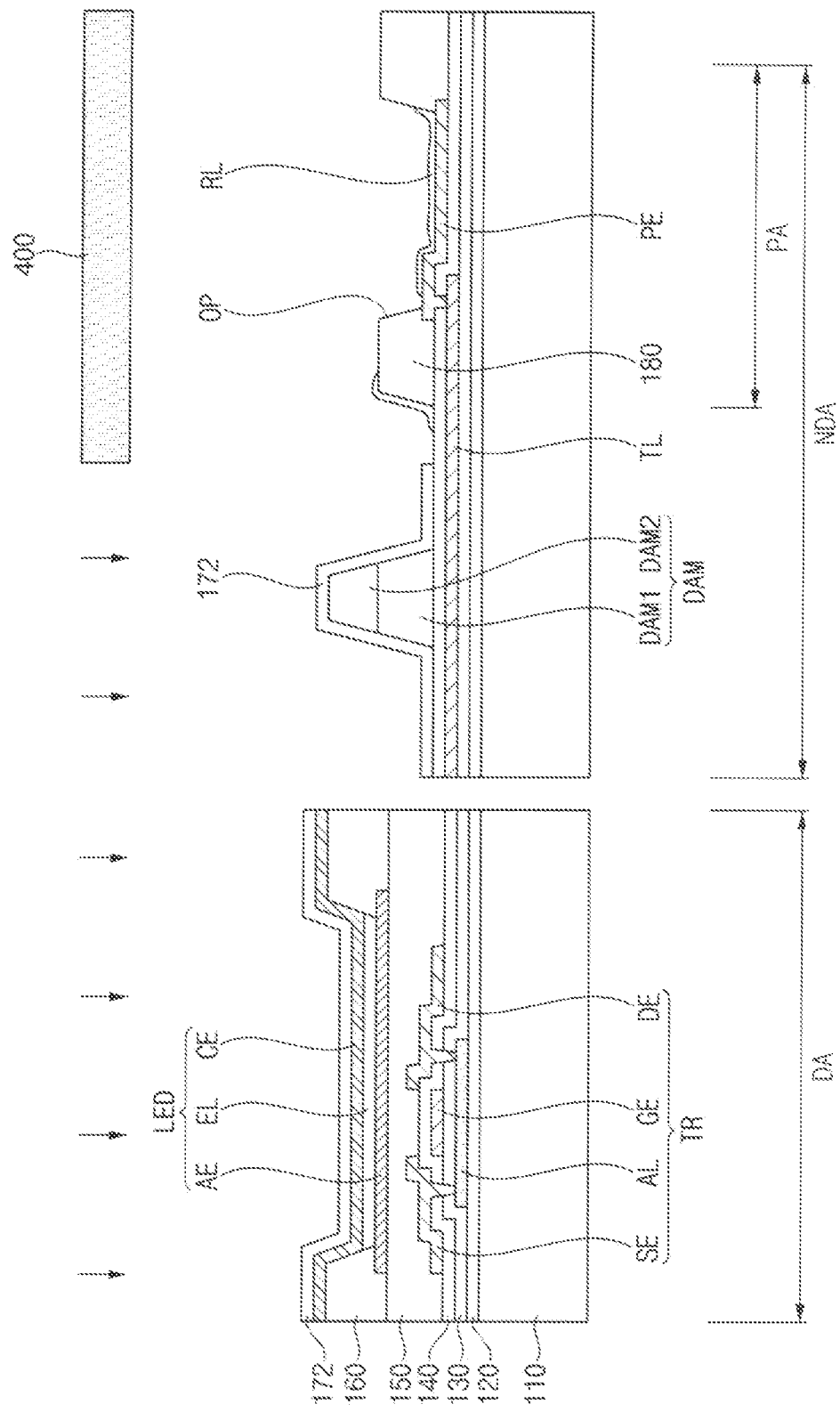
Figure 6:
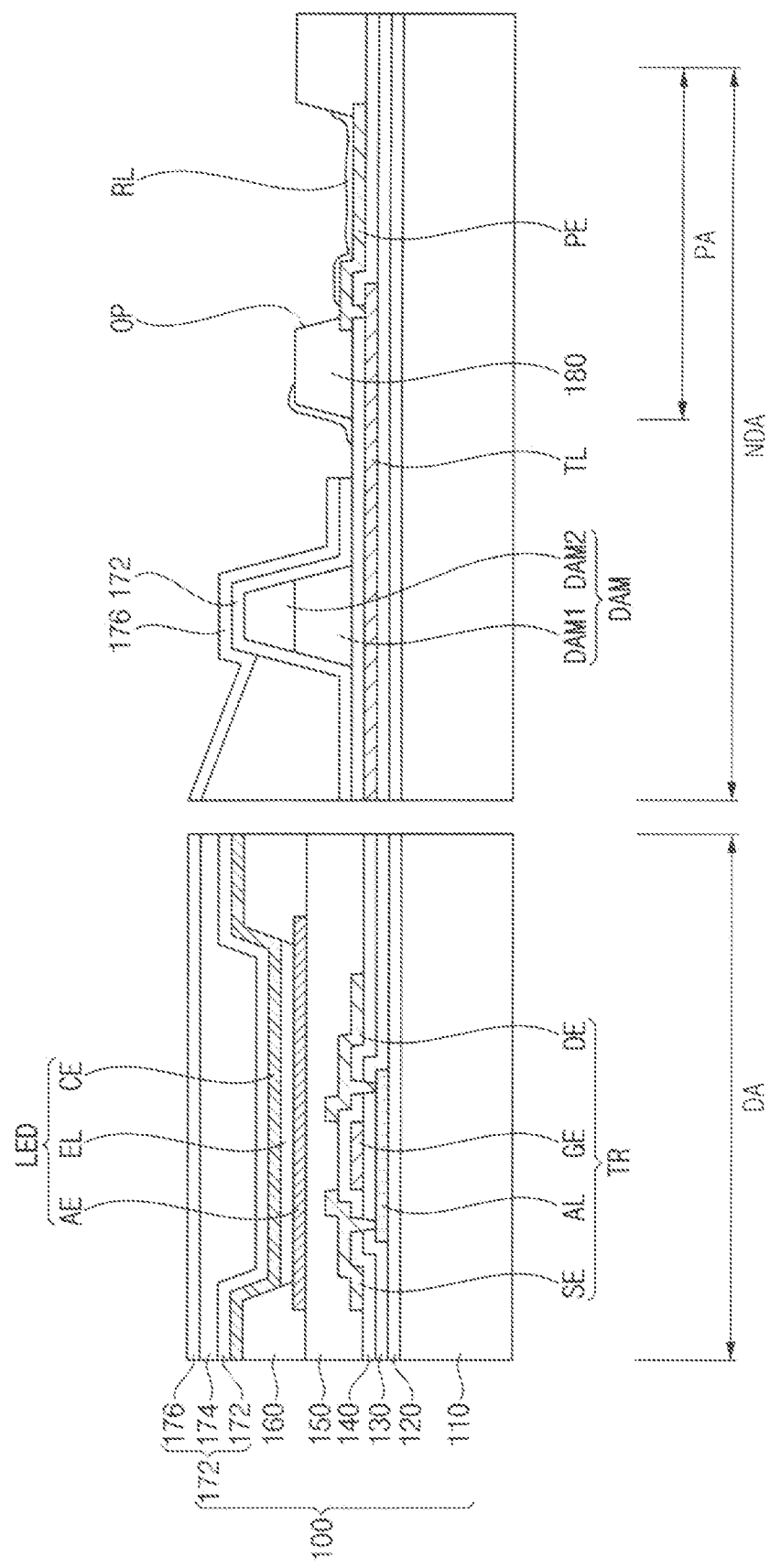

Referring to FIGS. 5 and 6, the encapsulation layer 170 covering the pixel may be formed. Referring to FIG. 5, the first inorganic encapsulation layer 172 covering the cathode CE may be formed.

The first inorganic encapsulation layer 172 may be formed on the display area DA and on a portion of the non-display area NDA outside the pad area PA using a silicon compound such as silicon oxide, silicon nitride, or silicon oxynitride. The first inorganic encapsulation layer 172 may be selectively deposited using a deposition mask 400 having an opening and a blocking part. The deposition mask 400 may be positioned over the substrate 110 such that the blocking part overlaps the pad area PA for blocking deposit material and that the opening overlaps the area outside the pad area PA for the deposit material to be deposited to form the first inorganic encapsulation layer 172. An end portion of the first inorganic encapsulation layer 172 adjacent to the pad area PA may be positioned at or near a boundary of the pad area PA. The end portion of the first inorganic encapsulation layer 172 adjacent to the pad area PA may have a relatively large taper angle (e.g., equal to or greater than about 80 degrees).

Subsequently, referring to FIG. 6, the organic encapsulation layer 174 may be formed on the first inorganic encapsulation layer 172. The organic encapsulation layer 174 may be formed by an inkjet method, in which an ink or a solution including an organic material is discharged to form the organic encapsulation layer 174. The organic encapsulation layer 174 may be surrounded by the dam DAM and may cover the display area DA.

The second inorganic encapsulation layer 176 may be formed on the organic encapsulation layer 174. The second inorganic encapsulation layer 176 may be formed outside the pad area PA using a silicon compound such as silicon oxide, silicon nitride, or silicon oxynitride. The second inorganic encapsulation layer 176 may be formed in substantially the same manner as the first inorganic encapsulation layer 172. The second inorganic encapsulation layer 176 may be selectively deposited on the underlying layers outside the pad area PA using the deposition mask 400. An end portion of the second inorganic encapsulation layer 176 adjacent to the pad area PA may be positioned at or near the boundary of the pad area PA. The end portion of the second inorganic encapsulation layer 176 adjacent to the pad area PA may have a relatively large taper angle (e.g., equal to or greater than about 80 degrees).

The second inorganic encapsulation layer 176 may be formed of a material different from a material of the first inorganic encapsulation layer 172. The first inorganic encapsulation layer 172 may be formed of silicon nitride, and the second inorganic encapsulation layer 176 may be formed of silicon oxynitride. The second inorganic encapsulation layer 176 may be formed of the same material as the first inorganic encapsulation layer 172.

When the first inorganic encapsulation layer 172 or the second inorganic encapsulation layer 176 is formed, a residual layer RL may be formed on the pad area PA. During the deposition process of the first inorganic encapsulation layer 172 or the second inorganic encapsulation layer 176, due to sagging of the deposition mask 400, the deposition material including the silicon compound may flow onto the pad area PA and may form the residual layer RL. The residual layer RL may include the same material as the first inorganic encapsulation layer 172 or the second inorganic encapsulation layer 176. The residual layer RL may include a silicon compound. A thickness of the residual layer RL may be less than each of a thickness of the first inorganic encapsulation layer 172 and a thickness of the second inorganic encapsulation layer 176. If the residual layer RL (including the silicon compound) remains on the portion of the upper surface of the pad electrode PE exposed by the opening OP of the organic insulating layer 180, an electrical connection with the pad electrode PE may be unsatisfactory, and/or the resistance of the pad electrode PE may increase, such that the reliability of the display device 10 may be unsatisfactory.

Figure 7:
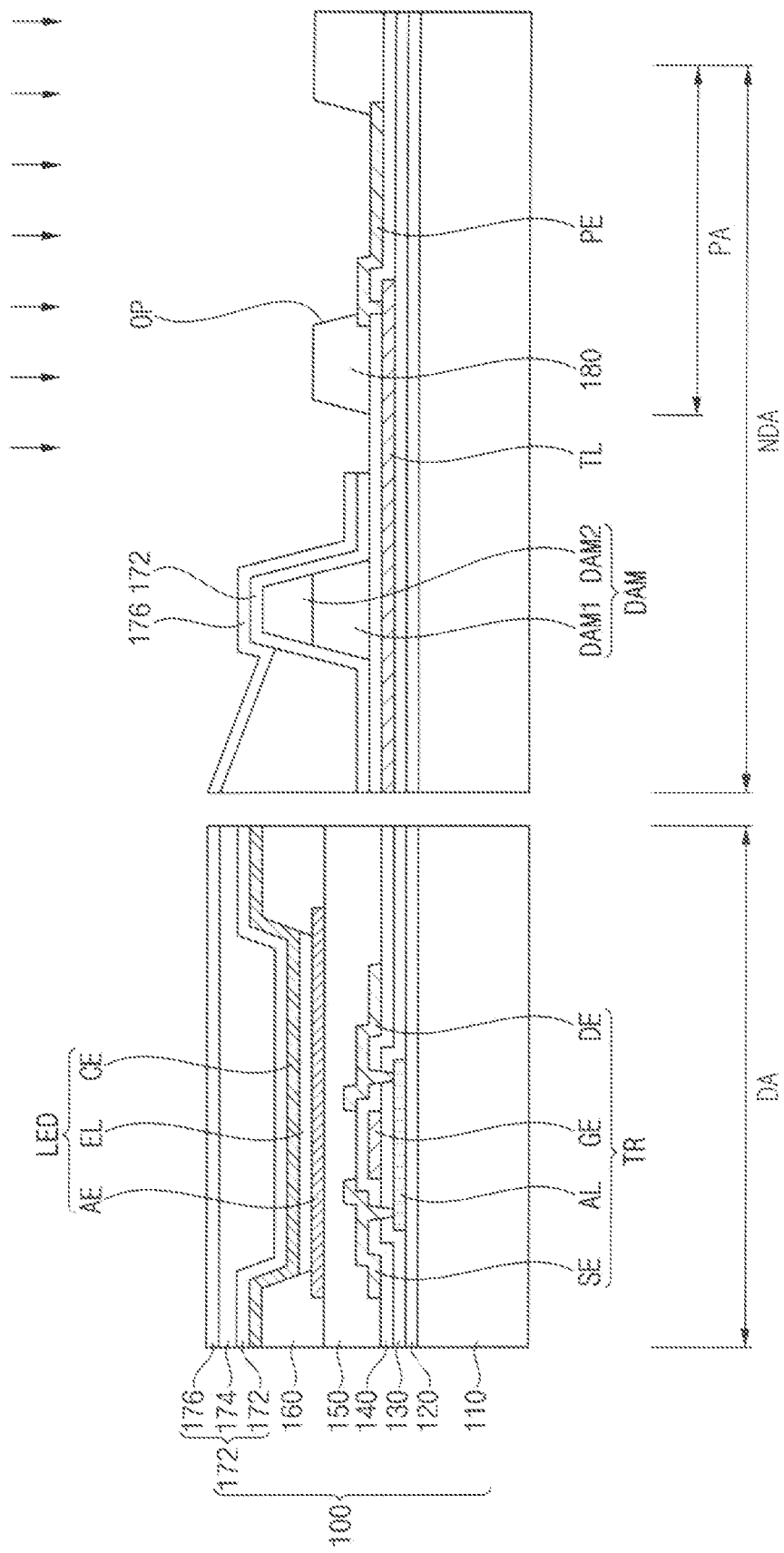
Figure 8:
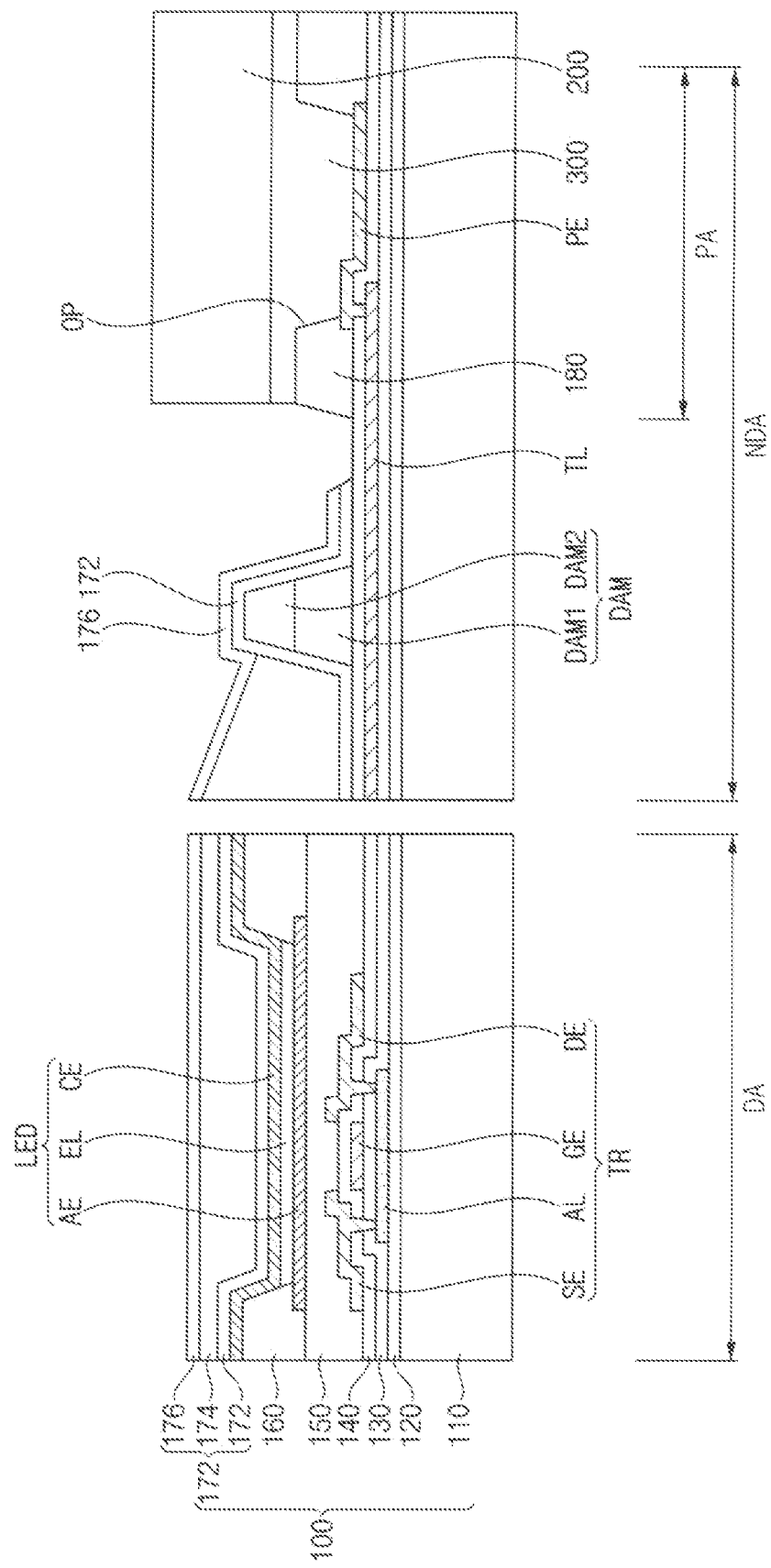

Referring to FIGS. 7 and 8, in order to remove the residual layer RL formed on the pad area PA and/or the pad electrode PE, the pad area PA and/or the pad electrode PE may be treated using a fluorine compound. The residual layer RL may be effectively removed by the fluorine compound. The pad area PA may be treated (e.g., by dry etching, plasma surface treatment, cleaning, etc.) using gas plasma (e.g., atmospheric plasma) including the fluorine compound. The pad area PA may be treated (e.g., by wet etching, cleaning, etc.) using a solution including the fluorine compound.

As the residual layer RL including the silicon compound is removed by treating the pad area PA with the gas plasma or the solution including the fluorine compound, in the upper surface of the pad electrode PE (i.e., the central portion of the pad electrode PE exposed by the opening OP of the organic insulating layer 180), a silicon content may decrease and a fluorine content may increase. As the treatment intensity of the pad area PA using the fluorine compound increases (e.g., as the treatment power, flow rate, or pressure increases), the residual layer RL including the silicon compound may be effectively removed. As a result, the fluorine content of the upper surface of the pad electrode PE may be greater than the silicon content of the upper surface of the pad electrode PE.

The fluorine content of the upper surface of the pad electrode PE may be equal to or greater than about 5 at %. Preferably, the fluorine content of the upper surface of the pad electrode PE may be equal to or greater than about 10 at %.

The silicon content of the upper surface of the pad electrode PE may be less than about 5 at %. Preferably, the silicon content of the upper surface of the pad electrode PE may be less than about 3 at %.

Referring to FIG. 7, the pad area PA may be selectively treated using the fluorine compound. The gas plasma or the solution including the fluorine compound may be provided to the pad area PA (and a portion of the non-display area NDA adjacent to the pad area PA) and may be spaced from the display area DA (and another portion of the non-display area NDA).

For example, by scanning the pad area PA using an atmospheric plasma jet, the gas plasma including the fluorine compound may be selectively provided only to the pad area PA and an adjacent area without using a mask. In order to sufficiently remove the residual layer RL on the pad area PA, a portion of the non-display area NDA adjacent to the pad area PA may be scanned together with the pad area PA. As a result, the end portion of the first inorganic encapsulation layer 172 adjacent to the pad area PA and/or the end portion of the second inorganic encapsulation layer 176 adjacent to the pad area PA may be etched to have a relatively small taper angle by the gas plasma including the fluorine compound. The end portion of the first inorganic encapsulation layer 172 adjacent to the pad area PA may have a first taper angle. The end portion of the second inorganic encapsulation layer 176 adjacent to the pad area PA may have a second taper angle. The first taper angle and/or the second taper angle may be equal to or less than about 50 degrees (referring to FIGS. 3 and 10).

An upper surface of the end portion of the second inorganic encapsulation layer 176 adjacent to the pad area PA may contain fluorine, and an upper surface of another portion of the second inorganic encapsulation layer 176 far from the pad area PA (e.g., an central portion of the second inorganic encapsulation layer 176 disposed in the display area DA) may not contain fluorine. An upper surface of a portion of the second inorganic encapsulation layer 176 positioned within about 7 mm from the pad area PA may contain fluorine, and a portion of the second inorganic encapsulation layer 176 positioned beyond 7 mm from the pad area PA may not contain fluorine. An upper surface of a portion of the second inorganic encapsulation layer 176 positioned within about 5 mm from the pad area PA may contain fluorine, and a portion of the second inorganic encapsulation layer 176 positioned beyond 5 mm from the pad area PA may not contain fluorine. An upper surface of a portion of the second inorganic encapsulation layer 176 positioned within about 1 mm from the pad area PA may contain fluorine, and a portion of the second inorganic encapsulation layer 176 positioned beyond 1 mm from the pad area PA may not contain fluorine.

The gas plasma including the fluorine compound may be selectively provided to the pad area PA using a mask.

Because the pad area PA is selectively treated using the fluorine compound, a portion (e.g., a central portion) of the second inorganic encapsulation layer 176 formed in the display area DA may be not removed or etched by the gas plasma or the solution including the fluorine compound, and only the residual layer RL formed in the pad area PA may be effectively removed. As a result, a surface roughness of an upper surface of the pad electrode PE (disposed on the pad area PA of the substrate 110) may be greater than a surface roughness of an upper surface of the central portion of the second inorganic encapsulation layer 176 disposed on the display area DA of the substrate 110. A surface roughness of the upper surface of the end portion of the second inorganic encapsulation layer 176 adjacent to the pad area PA may be greater than the surface roughness of the upper surface of the central portion of the second inorganic encapsulation layer 176 disposed on the display area DA. A side surface of the first inorganic encapsulation layer 172 adjacent to the pad area PA and a side surface of the second inorganic encapsulation layer 176 adjacent to the pad area PA may be aligned/coplanar with each other.

Both the display area DA and the non-display area NDA may be treated using the fluorine compound. The gas plasma or the solution including the fluorine compound may be provided to both the display area DA and the non-display area NDA including the pad area PA. In this case, portions of the second inorganic encapsulation layer 176 formed on the display area DA and the non-display area NDA may be partially removed by the fluorine compound. Since a thickness of the residual layer RL is much thinner than a thickness of the second inorganic encapsulation layer 176, most of the second inorganic encapsulation layer 176 may be retained when the entire residual layer RL is removed. In this case, the entire upper surface of the second inorganic encapsulation layer 176 may contain fluorine. Not only an upper surface of the portion of the second inorganic encapsulation layer 176 adjacent to the pad area PA, but also an upper surface of another portion of the second inorganic encapsulation layer 176 far from the pad area PA (e.g., an central portion of the second inorganic encapsulation layer 176 disposed in the display area DA) may contain fluorine.

After the residual layer RL formed in the pad area PA is removed, the conductive film 300 and the circuit board 200 may be attached to the pad area PA of the display panel 100. The circuit board 200 may be electrically connected to the pad electrode PE by the conductive film 300.

According to embodiments, after the encapsulation layer 170 is formed and before the circuit board 200 is attached, the residual layer RL may be reduced and/or removed by treatment of the pad area PA and/or the pad electrode PE using the fluorine compound. Accordingly, adverse effects on the connectivity or conductivity of the pad electrode PE due to the residual layer RL may be prevented or reduced. The upper surface of the pad electrode PE may be hydrophilic treated by the fluorine compound. Accordingly, adverse effects on the connectivity or conductivity of the pad electrode PE due to contamination of the upper surface of the pad electrode PE may be prevented or reduced. Advantageously, the reliability of the display device 10 may be satisfactory.

Effects of embodiments are described with reference to the following experimental examples.

Comparative Example 1

A display panel was manufactured by forming pad electrodes including ITO in a pad area on a substrate, and forming an inorganic encapsulation layer including silicon oxynitride in an area outside the pad area using a deposition mask.

Embodiment 1

The pad area of a display panel manufactured in the same manner as in Comparative Example 1 was dry-etched for 22 seconds using a gas including $C_4F_8$ at a power of 5000 W.

Embodiment 2

The pad area of a display panel manufactured in the same manner as in Comparative Example 1 was dry-etched for 88 seconds using a gas including $C_4F_8$ at a power of 550 W.

Embodiment 3

The pad area of a display panel manufactured in the same manner as in Comparative Example 1 was dry-etched for 28 seconds using a gas including $NF_3$ at a power of 7000 W.

Embodiment 4

The pad area of a display panel manufactured in the same manner as in Comparative Example 1 was dry-etched for 38 seconds using a gas including $NF_3$ at a power of 3000 W.

Experimental Example 1: Surface Component/Composition Analysis of the Pad Electrodes In Experimental Example 1, surface components/compositions of the pad electrodes of Comparative Examples 1 and Embodiments 1 to 4 were analyzed by EDS analysis. The surface component/composition of one of the pad electrodes of each of the Comparative Example 1 and Embodiments 1 to 4 was analyzed.

Figure 9A:
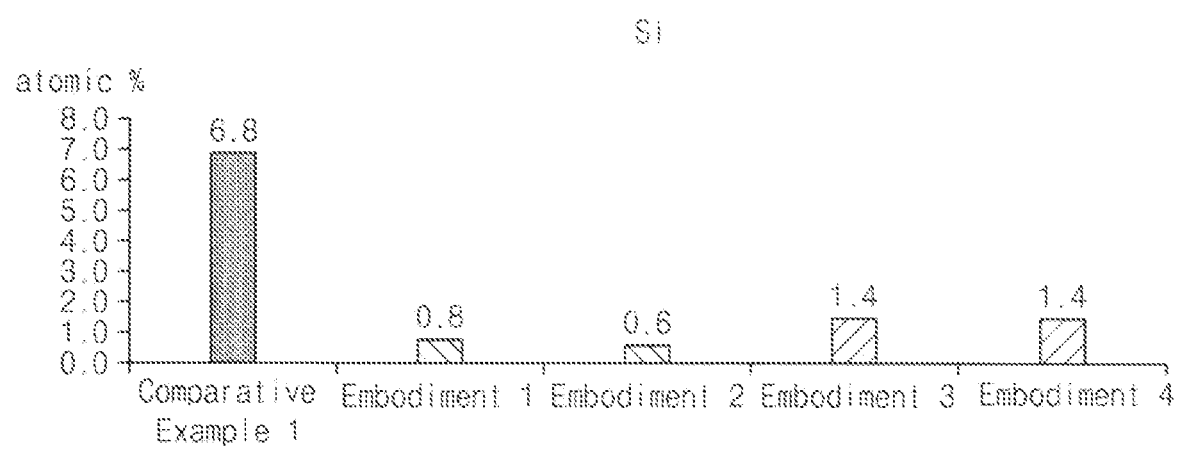
FIG. 9A is a graph illustrating silicon contents of surfaces of pad electrodes according to a comparative example and embodiments.
Figure 9B:
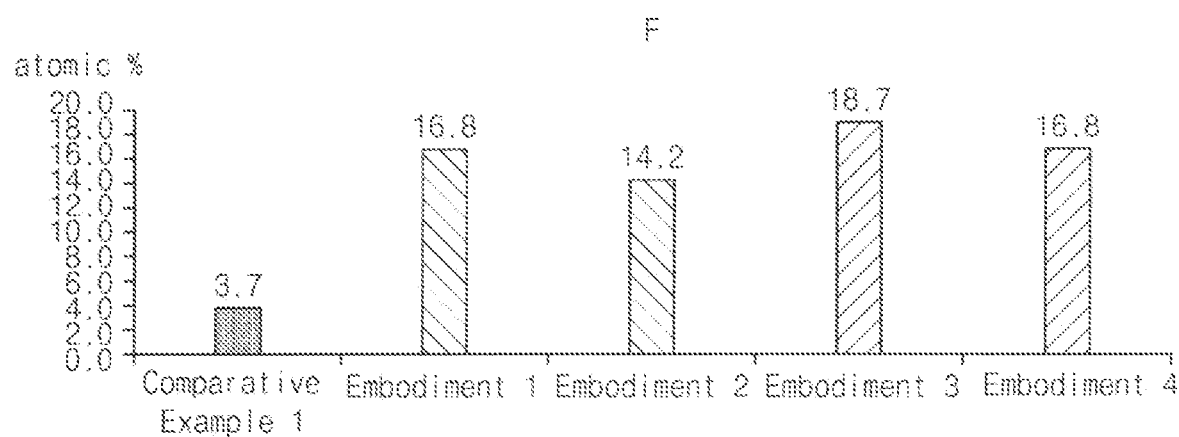
FIG. 9B is a graph illustrating fluorine contents of surfaces of pad electrodes according to a comparative example and embodiments.

FIG. 9A is a graph illustrating silicon contents of pad electrodes according to a comparative examples and embodiments. FIG. 9B is a graph illustrating fluorine contents of surfaces of pad electrodes according to a comparative example and embodiments.

Referring to FIG. 9A, in Comparative Example 1, the silicon content of the surface of the pad electrode was relatively high at 6.8 at %; in Embodiments 1 to 4, the silicon content on the surface of the pad electrode was relatively low in a range of 0.6 at % to 1.4 at %. Referring to FIG. 8B, in Comparative Example 1, the fluorine content of the surface of the pad electrode was relatively low at 3.7 at %; in Embodiments 1 to 4, the fluorine content of the surface of the pad electrode was relatively high in a range of 14.2 at % to 18.7 at %. In Embodiments 1 to 4, a residual layer including a silicon compound and formed on the pad electrode is effectively removed by the fluorine compound.

Experimental Example 2: Measurement of Resistance of the Pad Electrode

In Experimental Example 2, the resistances of the pad electrodes of Comparative Examples 1 to 6 and Embodiments 1 to 4 were measured. In each Comparative Examples 2 to 5, a display panel manufactured in the same manner as in Comparative Example 1. The measurement results of Comparative Examples and Embodiments according to Experimental Example 2 are illustrated in Table 1.

TABLE 1

|  | resistance (Ω) |
|---|---|
| Comparative Example 1 | 9.8 |
| Comparative Example 2 | 21.8 |
| Comparative Example 3 | 10.5 |
| Comparative Example 4 | 10.6 |
| Comparative Example 5 | 31.0 |
| Comparative Example 6 | 24.1 |
| Embodiment 1 | 3.4 |
| Embodiment 2 | 2.9 |
| Embodiment 3 | 3.3 |
| Embodiment 4 | 3.3 |

Referring to Table 1, in Comparative Examples 1 to 6, the resistance of the pad electrode was relatively high at 9.8Ω to 31.0Ω, but in Embodiments 1 to 4, the resistance of the pad electrode was relatively low at 2.9Ω to 3.4Ω. Accordingly, in Examples 1 to 4, it can be noted that the residual film including the silicon compound and formed on the pad electrode in the pad area is removed, thereby reducing the resistance of the pad electrode.

Figure 10A:
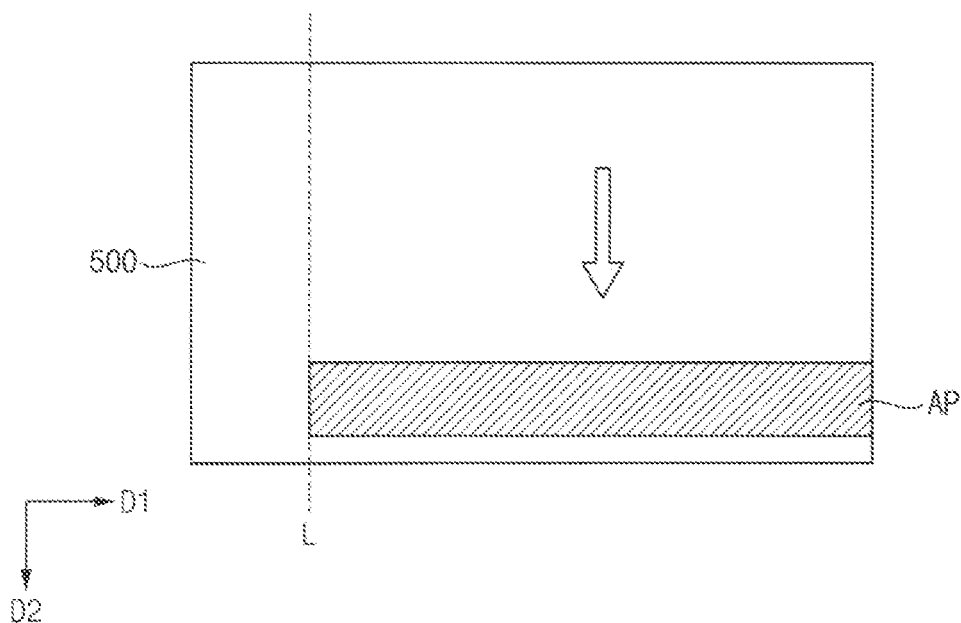
FIG. 10A is a view illustrating an atmospheric plasma treatment.
Figure 10B:
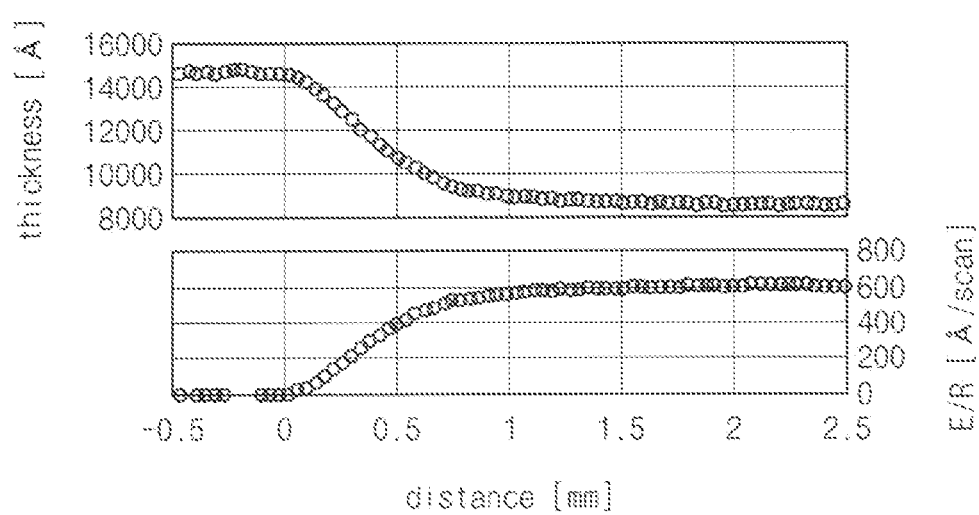
FIG. 10B is a view illustrating results of a simulation experiment for measuring a change in a taper angle of an inorganic film by an atmospheric plasma treatment.

Experimental Example 3: Measurement of Taper Angle of Inorganic Film by Atmospheric Plasma Treatment FIG. 10A is a view illustrating an atmospheric plasma treatment. FIG. 10B is a view illustrating results of a simulation experiment for measuring a change in a taper angle of an inorganic film by an atmospheric plasma treatment.

Referring to FIG. 10A, in Experimental Example 3, a simulation experiment was performed to measure a change in the taper angle of the inorganic film by the atmospheric plasma treatment. An inorganic layer 500 including SiON was deposited to a thickness of about 14000 Å on a substrate. When atmospheric plasma AP of a gas including $N_2$ (flow: 45 slm) and $NF_3$ (flow: 0.5 slm) was provided to an area positioned in a first direction D1 from line L, the substrate was moved in a second direction D2 to scan once; the process was repeated 10 times.

In the graph of FIG. 10B, x-axis represents a distance from the line L in the first direction D1, and y-axis represents a thickness of the inorganic layer 500 and an etch rate of the inorganic layer 500. Referring to FIG. 10B, the etch rate gradually increased up to a distance of about 1 mm from the line L, and the taper angle of the inorganic layer 500 was as low as about 50 degrees or less. Accordingly, when the residual layer RL on the pad area PA is removed by scanning the pad area PA using the atmospheric plasma jet, in order to sufficiently remove the residual layer RL on the pad area PA, it may be necessary to scan a portion of the non-display area NDA adjacent to the pad area PA together with the pad area PA. Therefore, referring to FIG. 3, the first taper angle θ1 of the first inorganic encapsulation layer 172 adjacent to the pad area PA or the second taper angle θ2 of the second inorganic encapsulation layer 176 adjacent to the pad area PA may be equal to or less than about 50 degrees.

Figure 11:
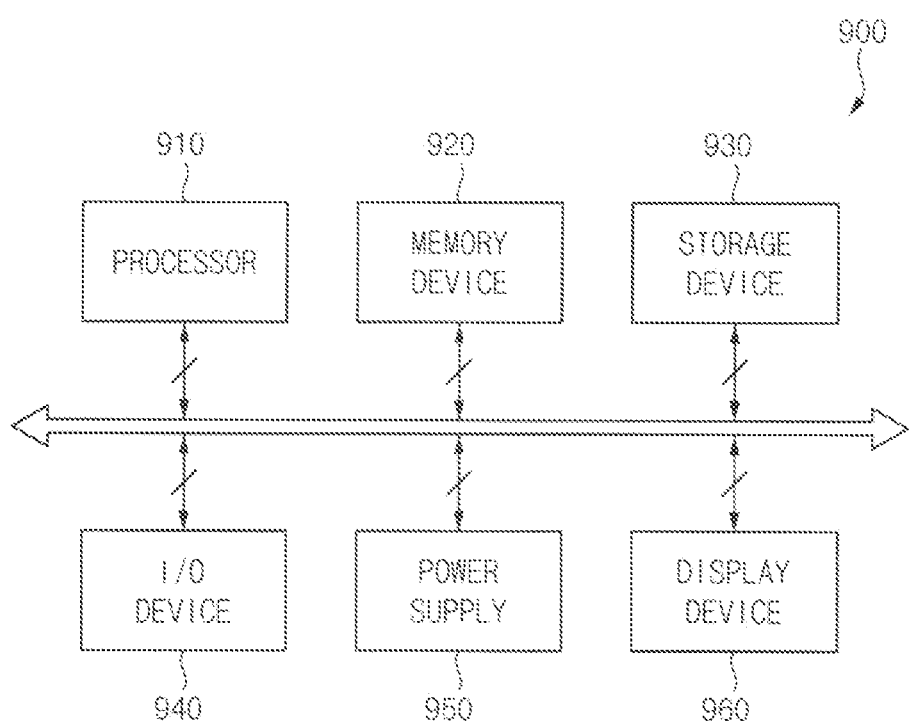
FIG. 11 is a block diagram illustrating an electronic device including the display device of FIG. 1 according to an embodiment.
Figure 12:
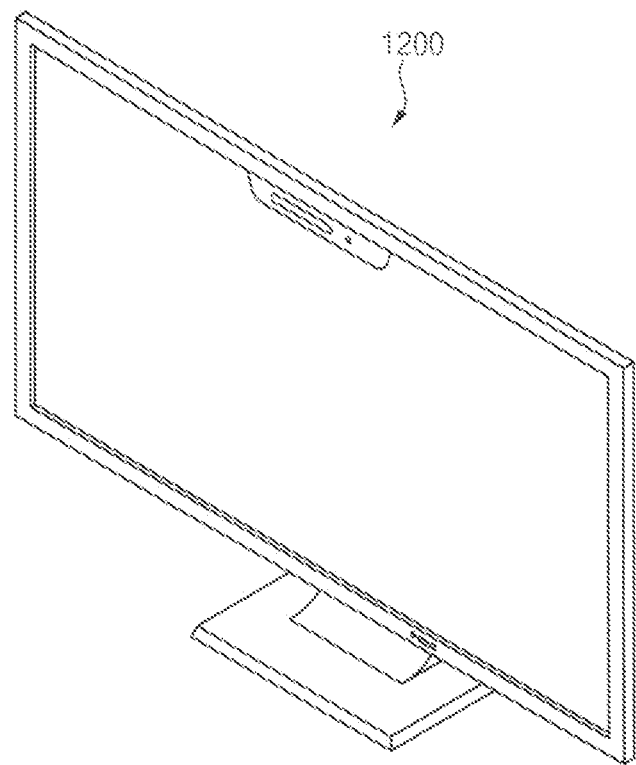
FIG. 12 is a diagram illustrating that the electronic device of FIG. 11 is a television according to an embodiment.
Figure 13:
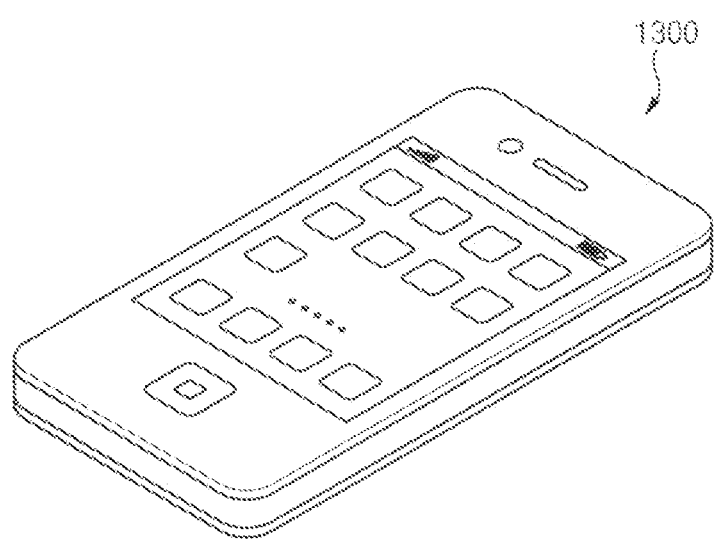
FIG. 13 is a diagram illustrating that the electronic device of FIG. 11 is a smart phone according to an embodiment.

FIG. 11 is a block diagram illustrating an electronic device including the display device of FIG. 1 according to an embodiment. FIG. 12 is a diagram illustrating that the electronic device of FIG. 11 is a television according to an embodiment. FIG. 13 is a diagram illustrating that the electronic device of FIG. 11 is a smart phone according to an embodiment.

Referring to FIGS. 11 to 13, an electronic device 900 may include a processor 910, a memory device 920, a storage device 930, an input/output ("I/O") device 940, a power supply 950, and a display device 960. The display device 960 may be identical to or analogous to the display device 10 described with reference to FIGS. 1 to 3. The electronic device 900 may further include a plurality of ports for communicating with a video card, a sound card, a memory card, a universal serial bus ("USB") device, or the like. Referring to FIG. 12, the electronic device 900 may be a television 1200. Referring to FIG. 13, the electronic device 900 may be a smart phone 1300. The electronic device 900 may be a cellular phone, a video phone, a smart pad, a smart watch, a tablet personal computer (tablet PC), a car navigation system, a computer monitor, a laptop, a head mounted display (HMD), or the like.

The processor 910 may perform computing functions. The processor 910 may be a microprocessor, a central processing unit ("CPU"), an application processor (AP), or the like. The processor 910 may be coupled to other components via an address bus, a control bus, a data bus, or the like. The processor 910 may be coupled to an extended bus such as a peripheral component interconnection (PCI) bus.

The memory device 920 may store data for operations of the electronic device 900. The memory device 920 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, or the like, and/or at least one volatile memory device such as a dynamic random access memory (DRAM) device, a static random access memory (SRAM) device, a mobile DRAM device, or the like.

The storage device 930 may include a solid state drive (SSD) device, a hard disk drive (HDD) device, a CD-ROM device, or the like. The I/O device 940 may include an input device such as a keyboard, a keypad, a mouse device, a touchpad, a touch-screen, or the like, and/or an output device such as a printer, a speaker, or the like.

The power supply 950 may provide power for operations of the electronic device 900. The display device 960 may be coupled to other components via the buses or other communication links. The display device 960 may be included in the I/O device 940.

Although examples of embodiments have been described, practical embodiments are not limited to the described embodiments. Practical embodiments may include various modifications and equivalent arrangements within the scope defined by the claims.

What is claimed is:

1. A display device comprising:
    a substrate including a display area and a pad area positioned outside the display area;
    a pixel disposed on the display area;
    an encapsulation layer covering the pixel;
    a pad electrode disposed on the pad area, wherein a first surface of the pad electrode contains fluorine, is an opposite side to a second surface of the pad electrode, and is positioned farther from the substrate than the second surface of the pad electrode; and
    a circuit board overlapping the pad electrode.

2. The display device of claim 1, wherein a fluorine content of the first surface of the pad electrode is equal to or greater than 5 atomic percent.

3. The display device of claim 2, wherein a silicon content of the first surface of the pad electrode is less than 5 atomic percent.

4. The display device of claim 1, wherein a fluorine content of the first surface of the pad electrode is greater than a silicon content of the first surface of the pad electrode.

5. The display device of claim 1, wherein a surface roughness of the first surface of the pad electrode is greater than a surface roughness of a first surface of the encapsulation layer, and wherein the first surface of the encapsulation layer is an opposite side to a second surface of the encapsulation layer and is positioned farther from the substrate than the second surface of the encapsulation layer.

6. The display device of claim 1, wherein the encapsulation layer includes a first inorganic encapsulation layer, an organic encapsulation layer disposed on the first inorganic encapsulation layer, and a second inorganic encapsulation layer disposed on the organic encapsulation layer,
    wherein the second inorganic encapsulation layer extends from the display area to an area between the display area and the pad area, and
    wherein a first portion of a first surface of the second inorganic encapsulation layer contains fluorine, is an opposite side to a second surface of the second inorganic encapsulation layer and is positioned farther from the substrate than the second surface of the second inorganic encapsulation layer.

7. The display device of claim 6, wherein the first portion of the first surface of the second inorganic encapsulation layer is an end portion of the first surface of the second inorganic encapsulation layer positioned between the pixel and the pad area, and wherein the second inorganic encapsulation layer contains fluorine only at the end portion of the first surface of the second inorganic encapsulation layer.

8. The display device of claim 6, wherein the first portion of the first surface of the second inorganic encapsulation layer overlaps each of the display area and the area between the display area and the pad area.

9. The display device of claim 6, wherein an end face of the first inorganic encapsulation layer is positioned between the pixel and the pad area and is oriented at a first angle relative to the substrate, wherein an end face of the second inorganic encapsulation layer is positioned between the pixel and the pad area and is oriented at a second angle relative to the substrate, and wherein at least one of the first angle and the second angle is equal to or less than 50 degrees.

10. The display device of claim 6, wherein an end face of the first inorganic encapsulation layer and an end face of the second inorganic encapsulation layer are positioned between the pixel and the pad area and are coplanar with each other.

11. A display device comprising:
    a substrate including a display area and a pad area positioned outside the display area;
    a pixel disposed on the display area;
    an encapsulation layer covering the pixel and including a first inorganic encapsulation layer, an organic encapsulation layer disposed on the first inorganic encapsulation layer, and a second inorganic encapsulation layer disposed on the organic encapsulation layer and extending from the display area to an area between the display area and the pad area, wherein a first portion of a first surface of the second inorganic encapsulation layer contains fluorine, is an opposite side to a second surface of the second inorganic encapsulation layer and is positioned farther from the substrate than the second surface of the second inorganic encapsulation layer;
    a pad electrode disposed on the pad area; and
    a circuit board overlapping the pad electrode.

12. The display device of claim 11, wherein the first portion of the first surface of the second inorganic encapsulation layer is an end portion of the first surface of the second inorganic encapsulation layer positioned between the pixel and the pad area, and wherein the second inorganic encapsulation layer contains fluorine only at the end portion of the first surface of the second inorganic encapsulation layer.

13. The display device of claim 11, wherein the first portion of the first surface of the second inorganic encapsulation layer overlaps each of the display area and the area between the display area and the pad area.

14. The display device of claim 11, wherein an end face of the first inorganic encapsulation layer is positioned between the pixel and the pad area and is oriented at a first angle relative to the substrate, wherein an end face of the second inorganic encapsulation layer is positioned between the pixel and the pad area and is oriented at a second angle relative to the substrate, and wherein at least one of the first angle and the second angle is equal to or less than about 50 degrees.

15. The display device of claim 11, wherein a first surface of the pad electrode contains fluorine, is an opposite side to a second surface of the pad electrode, and is positioned farther from the substrate than the second surface of the pad electrode.

16. The display device of claim 15, wherein a fluorine content of the first surface of the pad electrode is equal to or greater than 5 atomic percent.

17. The display device of claim 16, wherein a silicon content of the first surface of the pad electrode is less than 5 atomic percent.

18. The display device of claim 15, wherein a fluorine content of the first surface of the pad electrode is greater than a silicon content of the first surface of the pad electrode.

19. A method of manufacturing a display device, the method comprising:
    forming a pad electrode on a pad area of a substrate;
    forming a pixel on a display area of the substrate, wherein the pad area of the substrate is positioned outside the display area of the substrate;
    forming an encapsulation layer that covers the pixel;
    treating the pad electrode using a fluorine compound to remove a residual layer from a first surface of the pad electrode, wherein the first surface of the pad electrode is an opposite side to a second surface of the pad electrode and is positioned farther from the substrate than the second surface of the pad electrode; and
    providing a circuit board that overlaps the pad electrode.

20. The method of claim 19, wherein the forming of the encapsulation layer includes:
    forming a first inorganic encapsulation layer including a first silicon compound and spaced from the pad area;
    forming an organic encapsulation layer overlapping the display area and overlapping the first inorganic encapsulation layer; and
    forming a second inorganic encapsulation layer including a second silicon compound, spaced from the pad area, and overlapping the organic encapsulation layer, wherein the second silicon compound is identical to or different from the first silicon compound, and wherein the residual layer and the first inorganic encapsulation layer or the second inorganic encapsulation layer are formed simultaneously and are formed of a same material.

21. The method of claim 20, wherein, in the treating of the pad electrode, the pad area is selectively treated using the fluorine compound when the display area is spaced from the fluorine compound.

22. The method of claim 20, wherein a thickness of the residual layer is less than a thickness of the second inorganic encapsulation layer, and
    wherein, in the treating of the pad electrode, both the display area and the pad area are treated using the fluorine compound.

23. The method of claim 19, wherein the treating of the pad area uses gas plasma that includes the fluorine compound.

24. The method of claim 19, wherein the treating of the pad area uses a solution that includes the fluorine compound.

* * * * *